US00RE45797E

(19) United States
(12) Reissued Patent
Kim

(10) Patent Number: US RE45,797 E
(45) Date of Reissued Patent: Nov. 10, 2015

(54) METHOD AND APPARATUS FOR DISPLAYING CHARGING-STATE OF BATTERY OF PORTABLE TERMINAL

(71) Applicant: Samsung Electronics Co., Ltd., Gyeonggi-do (KR)

(72) Inventor: Han Lim Kim, Daegu (KR)

(73) Assignee: Samsung Electronics Co., Ltd., Yeongtong-gu, Suwon-si, Gyeonggi-do (KR)

(21) Appl. No.: 13/974,581

(22) Filed: Aug. 23, 2013

Related U.S. Patent Documents

Reissue of:
(64) Patent No.: 8,004,241
Issued: Aug. 23, 2011
Appl. No.: 11/936,177
Filed: Nov. 7, 2007

(30) Foreign Application Priority Data

Nov. 9, 2006 (KR) ..... 10-2006-0110683

(51) Int. Cl.
*H02J 7/00* (2006.01)
*H01M 10/44* (2006.01)

(52) U.S. Cl.
CPC ..... *H02J 7/0047* (2013.01)

(58) Field of Classification Search
CPC ..... H02J 7/0021; H02J 7/0047
USPC ..... 320/132, 162, DIG. 21; 324/433; 429/90, 91, 92, 93
See application file for complete search history.

(56) References Cited

U.S. PATENT DOCUMENTS

| | | | | |
|---|---|---|---|---|
| 5,406,188 | A | 4/1995 | Myslinski et al. | 320/14 |
| 6,405,062 | B1 * | 6/2002 | Izaki | 455/573 |
| 7,188,005 | B2 * | 3/2007 | Toba et al. | 701/1 |
| 8,004,241 | B2 * | 8/2011 | Kim | 320/132 |

FOREIGN PATENT DOCUMENTS

| | | | |
|---|---|---|---|
| JP | 2001-188080 | | 7/2001 |
| JP | 2001-188080 | A | 7/2001 |
| KR | 20-0214925 | | 12/2000 |
| KR | 20-0214925 | Y1 | 12/2000 |
| KR | 10-2003-0069508 | A | 8/2003 |
| KR | 2003-69508 | | 8/2003 |
| KR | 10-2003-0092752 | A | 12/2003 |
| KR | 2003-92752 | | 12/2003 |
| KR | 10-2005-0059452 | A | 6/2005 |
| KR | 2005-59452 | | 6/2005 |
| KR | 10-2206-0053725 | A | 5/2006 |
| KR | 2006-53725 | | 5/2006 |
| KR | 10-0643460 | | 10/2006 |
| KR | 10-0643460 | B1 | 10/2006 |
| KR | 10-0686083 | | 2/2007 |
| KR | 10-0686083 | B1 | 2/2007 |
| KR | 10-2007-0050116 | A | 5/2007 |
| KR | 2007-50116 | | 5/2007 |

* cited by examiner

*Primary Examiner* — Edward Tso
(74) *Attorney, Agent, or Firm* — Cha & Reiter, LLC

(57) ABSTRACT

A method and apparatus for displaying a battery charging-state is disclosed. The method comprises measuring the charged voltage of a battery unit, determining the charging stage of the measured charged voltage, and sequentially and cyclically displaying icons that indicate a charging stage.

32 Claims, 5 Drawing Sheets

PRIOR ART

METHOD AND APPARATUS FOR DISPLAYING CHARGING-STATE OF BATTERY OF PORTABLE TERMINAL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CLAIM PRIORITY

This application claims the benefit of the earlier filing date, pursuant to 35 USC 119, to that patent application entitled "Method and Apparatus for Displaying Charging-State of Battery of Portable Terminal," filed in the Korean Intellectual Property Office on Nov. 9, 2006 and assigned Serial No. 2006-0110683, the contents of which are incorporated herein by reference.

BACKGROUND OF THE INVENTION

1. Field of the Invention

The present invention relates to a portable terminal, and more particularly, to a method and apparatus that displays the charging-state of a battery of a portable terminal.

2. Description of the Related Art

Portable terminals are manufactured to provide a variety of functions (for example, a mobile communication service, a camera, an MP3 player, a digital multimedia broadcasting service). Since such functions are frequently used through a portable terminal, the portable terminals are ever increasing their power consumption.

In response to this increase in power consumption, the battery of a portable terminal must be frequently recharged.

The following is a description of a conventional method for displaying a charged state of a portable terminal battery.

FIG. 1 is a screen showing a battery charging-state of a conventional portable terminal.

As shown by reference numeral 110, the conventional portable terminal has cyclically displayed icons a, b, c, and d, which are indicative of charging stages, respectively, regarding of charging-states according to the charging voltage of a battery unit. When the charging-state of the battery unit becomes a fully charged state, the icon "d," which is a still image, is displayed on the display, as shown by reference numeral 120.

As such, the conventional charging-state display method only indicates that the battery unit has been charged, but does not display what stage or how much the battery unit is charged. Therefore, it is inconvenient in that a user cannot check how much the battery unit is charged or check how much charging capacity of the battery unit remains.

As well, the conventional portable terminal has disadvantages in that it forces the user to wait, without knowing, how much more time is required to recharge the battery since the terminal does not indicate the recharge time.

SUMMARY OF THE INVENTION

In order to resolve the above problems, the present invention is to provide a method and apparatus that can form icons corresponding to the charging states of a battery of a portable terminal and display the icons on the display, so that a user can check at least one of the charging state, charging capacity, and remaining capacity of a battery.

According to the present invention, there is provided a method for displaying a battery charging state of a portable terminal, comprising measuring a charged voltage of a battery unit; judging the charging stage of the measured charged voltage, sequentially displaying icons that indicate stages of charging and cyclically performing the above steps.

In accordance with the present invention, there is provided a portable terminal comprising: a storage unit for storing charging-stage display information where the charging stage of a charging voltage matches the icon data, a battery unit for charging charges supplied from a power source and for converting the charged voltage caused by the charges into a digital signal, a controller for determining icon data based on the charging stage and a display unit for displaying icons based on the determined icon data.

BRIEF DESCRIPTION OF THE DRAWINGS

The above features and advantages of the present invention will be more apparent from the following detailed description in conjunction with the accompanying drawings, in which.

DETAILED DESCRIPTION OF THE INVENTION

Figure 1:
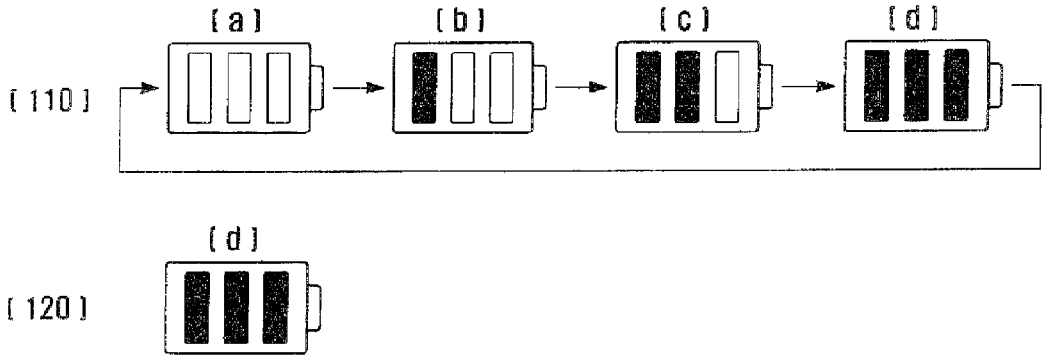
FIG. 1 is a screen showing a battery charging-state of a conventional portable terminal.

The terminologies in the present application are defined as follows:

The portable terminal of the present invention refers to a concept including all the devices that are portable and receive electric-power from a battery. Such terminals may for example, be a mobile communication terminal, a mobile phone, a personal digital assistant (PDA), a smart phone, a digital multimedia broadcasting (DMB) receiver, an MP3 player, a digital camera, etc.

Although a battery is recharged through a plurality of processes, for convenience, the recharging processes according to the present invention will be described based on four stages. However, it will be easily appreciated to those skilled in the art that the present invention is not limited by the following embodiments described based on the four recharging stages.

For four recharging stages of a battery, the present invention introduces four icons wherein each icon corresponds to one of four exemplary charging stages as follows:

The icon labeled a (hereinafter referred to as 'icon a') denotes stage 0, indicative of a first charging state of a battery. The icon labeled b (hereinafter referred to as 'icon b') denotes stage 1, indicative of a second charging state of the battery. Similar to the icons a and b, icons c and d are defined to denote stages 2 and 3 indicative of corresponding charging states of the battery, respectively. The icons a, b, c, and d are stored in a storage unit of the portable terminal.

Embodiments of the present invention are described in detail with reference to the accompanying drawings. Elements and regions in the drawings may be schematically illustrated for brevity and clarity.

Figure 2:
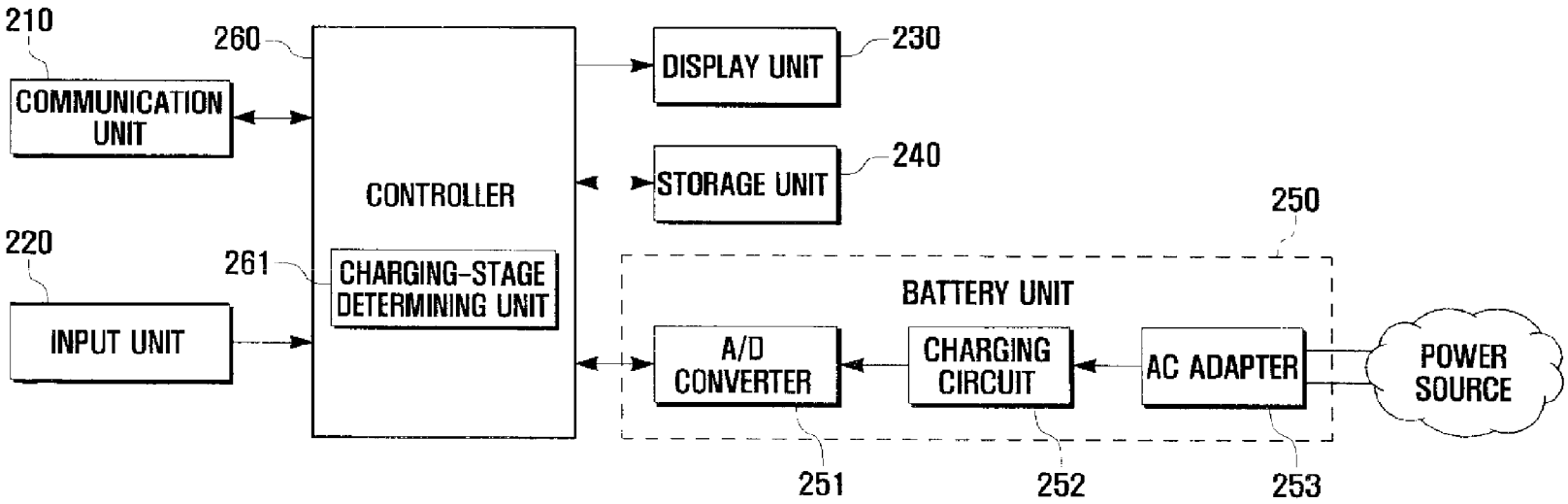
FIG. 2 is a schematic block diagram illustrating a configuration of a portable terminal according to an embodiment of the present invention.

FIG. 2 is a schematic block diagram illustrating a configuration of a portable terminal according to an embodiment of the present invention.

As shown in FIG. 2, the portable terminal includes a communication unit 210, an input unit 220, a display unit 230, a storage unit 240, a battery unit 250, and a controller 260.

The communication unit 210 is configured to include: a radio frequency (RF) transmitter for up-converting the frequency of transmitted signals and amplifying the transmitted signals and an RF receiver for low-noise amplifying a received RF signal and down-converting the frequency of the received RF signal.

The input unit 220 can be implemented by a touch pad or a key pad that includes various function keys, numeral keys, special keys, and character keys, etc. The input unit 220 serves to transmit signals input by a user to the controller 260 to control operations of the portable terminal.

The display unit 230 can be implemented by a liquid crystal display (LCD), etc., and displays various display data and operation states of the portable terminal. Specifically, the display unit 230 of the present invention displays icons indicative of charging states of the battery unit 250, according to icon data stored in the storage unit 240. The display unit 230 may also act as input unit 220 when a touch screen capability is available.

The storage unit 240 stores programs and data, which are required for the portable terminal operations. Specifically, the storage unit 240 stores charging-state display information as shown in Table 1.

TABLE 1

| Charged Voltage | Charging | Icon Data | |
|---|---|---|---|
| [V] | Stage | Type of Icon | Display Sequence |
| 2.05~2.09999 | Stage 0 | a, b, c, d | a -> b -> c -> d -> a -> b . . . |
| 2.1~2.49999 | Stage 1 | b, c, d | b -> c -> d -> b -> c . . . |
| 2.5~2.89999 | Stage 2 | c, d | c -> d -> c -> d . . . |
| 2.9 | Stage 3 | d | d |

As described in Table 1, the charging-state display information includes a charged voltage charged in a charging circuit 252, a charging state corresponding to the charged voltage, and icon data indicative of corresponding charging states (or charging voltages). The charging-state display information is preferably stored as a database, matching the charging voltage, charging-state, and icon data with each other.

As well, the icon data includes the type of icon, which corresponds to the charging stage of the battery unit 250, and display sequence for the icons.

For example, when the charged voltage of the charging circuit 252 is 2.23V, the controller 260 determines that the charging stage is stage 1, and then selects icons b, c, and d from a sub field of Type of Icon in the Icon Data field, as shown in Table 1.

After that, the controller 260 controls the display unit 230 so that the selected icons b, c, and d can be displayed according to the display sequence of b->c->d->b->c-> . . . in a sub field of the Display Sequence in the Icon Data field.

The battery unit 250 converts AC power (110 V or 220 V) from a power source into DC power and charges the battery using the DC power. After that, the battery unit 250 converts the charged voltage into a digital signal and transmits it to the controller 260.

To this end, the battery unit 250 is preferably configured to include an AC adapter 253, a charging circuit 252, and an A/D converter 251.

The AC adapter 253 converts AC power (110 V or 220 V) from the power source into DC power. The charging circuit 252 charges based on the DC power outputted from the AC adapter 253. The A/D converter 251 converts the charged voltage of the charging circuit 252, which is an analog signal, into a digital signal and transmits it to the controller 260.

The controller 260 controls the entire operation of the portable terminal.

Specifically, the controller 260 of the present invention detects a voltage as a digital signal which the A/D converter 251 has converted, and determines a charging state based on the detected charged voltage.

To this end, the controller 260 is preferably configured to include a charging-stage determining unit 261. As well, the controller 260 performs the control in such a way that icons indicative of charging stages of the battery unit 250 can be displayed, according to the icon data stored in the storage unit 240.

Figure 3:
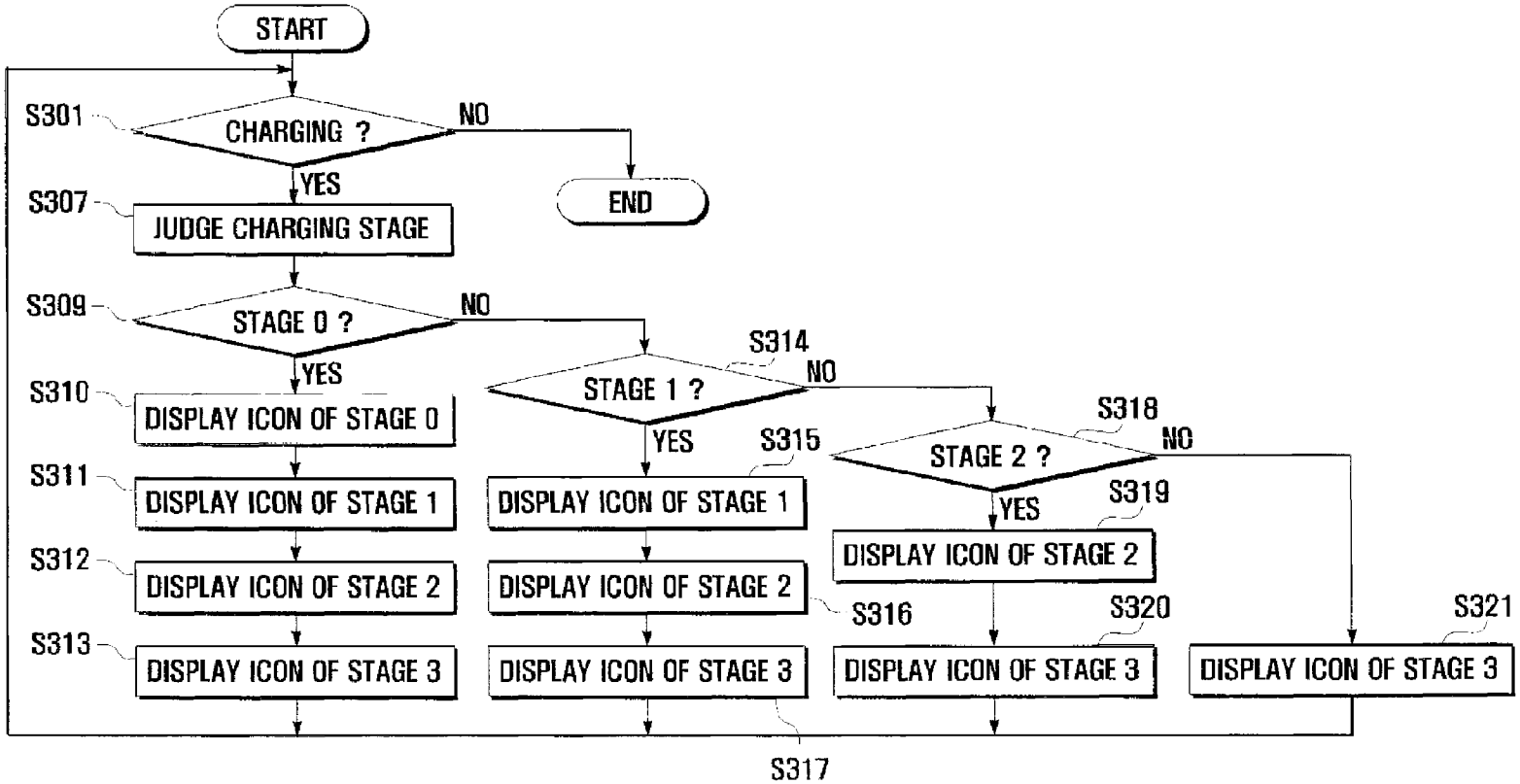
FIG. 3 is a flowchart describing operations of a portable terminal according to an embodiment of the present invention.

FIG. 3 is a flowchart describing a method for determining and displaying a charged voltage of a portable terminal according to an embodiment of the present invention.

As shown in FIGS. 1 and 2, the controller 260 makes a determination as to whether the battery unit 250 is charging the battery based on power supplied from a power source (S301).

More specifically, when the power is applied to the battery unit 250, the charging circuit 252 charges the battery. The A/D converter 251 measures a voltage caused by the charging voltage and converts it into a digital voltage value (i.e., a digital signal).

When the determination of step S301 is positive, the charging-stage determining unit 261 of the controller 260 receives the digital voltage value provided by the A/D converter 251, which converts the determined charged voltage, and determines the charging stage of the battery and based on the charging stage displays information stored in the storage unit 240 (S307).

The controller 260 makes a determination whether the charged voltage of the battery unit 250 is within the voltage range of stage 0 (S309). When the determination of step S309 is positive, the controller 260 controls the display unit 230 so that an icon indicative of a charging-state of stage 0 can be displayed (S310).

Next, the controller 260 performs the control in such a way that icons corresponding to stage 1 (S311), stage 2 (S312), and stage 3 (S313) can be sequentially displayed. For example, when the charged voltage is less than 2.0999V, as shown by reference numeral 410 of FIG. 4, the icons are cyclically displayed as the sequence of a, b, c, and d.

After that, the procedure returns to step S301 so that the controller 260 determines whether power is applied to the battery unit 250, and then repeatedly proceeds with the above steps.

On the other hand, when the determination of step S309 is negative, or the charged voltage is not within the voltage range of stage 0, the controller 260 determines whether the charged voltage is within the charged voltage range of stage 1 (S314).

When the determination of step S314 is positive, the controller 260 controls the display unit 230 so that an icon indicative of a charging state of stage 1 can be displayed (S315).

After the display of the stage 1 icon (S315), the controller 260 performs the control in such a way that icons corresponding to stage 2 (S316) and stage 3 (S317) can be sequentially displayed. For example, when the charged voltage is in the range of 2.1~2.49999V, as shown by reference numeral 420 of FIG. 4, the icons are cyclically displayed as the sequence of b, c, and d.

The procedure returns to step S301 so that the controller 260 determines whether power is applied to the battery unit 250, and then repeatedly proceeds with the above steps.

When the determination of step S314 is negative, or the charging voltage is not within the charged voltage range of stage 1, the controller 260 determines whether the charged voltage is within the charged voltage range of stage 2 (S318).

When the determination of step S318 is positive, or the charging voltage is within the charged voltage range of stage 2, the controller 260 controls the display unit 230 so that icons indicative of charging states of stage 2 (S319) and stage 3 (S320) can be displayed.

After that, the controller 260 performs the control in such a way that icons corresponding to stage 2 (S319) and stage 3 (S320) can be sequentially displayed. That is, when the charged voltage is in the range of 2.5~2.8999V, as shown by reference numeral 430 of FIG. 4, the icons are cyclically displayed as the sequence of c and d.

Next, the procedure returns to step S301 so that the controller 260 determines whether power is applied to the battery unit 250, and then repeatedly proceeds with the above steps.

In addition, when the determination of step S318 is negative, or the charged voltage is not within the charging voltage range of stage 2, the controller 260 determines that the charged voltage is within the charged voltage of stage 3 (fully charged state), and controls the displays unit so that the icon indicative of a fully charged state of stage 3 can be displayed (8321). That is, when the charged voltage is 2.9V, as shown by reference numeral 440, the icon d, which is a still image, is displayed.

Figure 4:
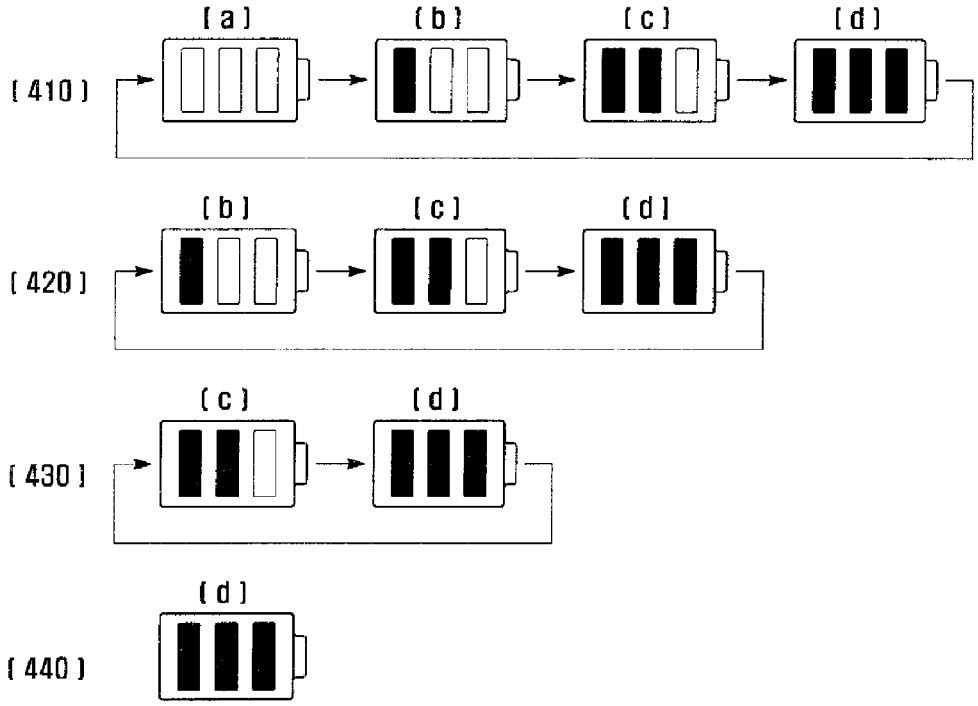
FIG. 4 is a screen showing a battery charging state according to an embodiment of the present invention.

FIG. 4 is a screen showing a battery charging state according to an embodiment of the present invention.

Referring to FIG. 4, the controller 260 measures the charged voltage of the battery unit 250 to check the charging stage corresponding to the measured charged voltage, and then displays an icon corresponding to the charging stage.

After that, the controller 260 sequentially displays icons that correspond to a charging stage higher than the stage of the displayed icon through to the fully charged stage.

For example, when power is applied to the battery unit 250, whose charging state is stage 0, the display unit 230 cyclically displays icons a, b, c, and d, in order, as shown by reference numeral 410 of FIG. 4. After that, the battery unit 250 arrives at the charging state of stage 1, and the display unit 230 cyclically displays icons b, c, and d, in order, as shown by reference numeral 420 of FIG. 4. In addition, the voltage of battery unit 250 arrives at the charging state of stage 2, and the display unit 230 cyclically displays icons c, and d, in order, as shown by reference numeral 430 of FIG. 4. Repeatedly, the battery unit 250 arrives at the charging state of stage 3, and the display unit 230 displays the icon d, which is a still image, as shown by reference numeral 440 of FIG. 4.

Figure 5:
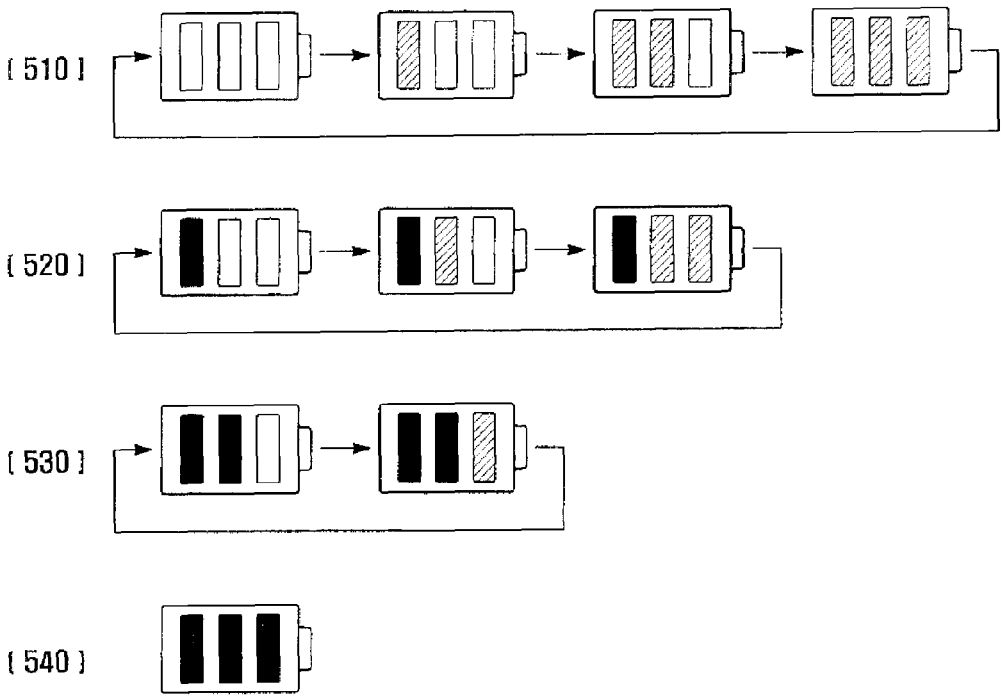
FIG. 5 is a screen showing a battery charging state according to another embodiment of the present invention.

FIG. 5 is a screen showing a battery charging state according to another embodiment of the present invention.

Referring to FIG. 5, the controller 260 displays icons, distinguishing between a region (or regions) of the icons, indicating that a charging stage has been completed, and another region (or regions), indicating that charging is presently performed. Such a displaying method is to allow a user to read the charging stages of the battery unit 250 without trouble. Preferably, this method distinguishes charging states by color, brightness, or patterns formed on corresponding regions of the icons.

For example, when the voltage of battery unit 250 is in a charging state of stage 0, the controller 260 cyclically displays icons whose corresponding regions of the icons are only filled with only slanted lines, to indicate that it is presently charging, as shown by reference numeral 510 in FIG. 5. After completing stage 0, the controller 260 fills the first region (level 1) of the icons with a color, for example, a dimmed color, and, at the same time, cyclically displays the icons whose first region is filled with a dimmed color and whose second and third regions of the icons (level 2 and level 3, respectively) are filled with slanted lines, to indicate that it is presently charging, as shown by reference numeral 520 in FIG. 5. After completing stage 1, the controller 260 further fills the second region of the icons with the same color as the first regions, and, at the same time, cyclically displays the icons whose first and second regions are filled with the dimmed color and whose third region is filled with slanted lines, to indicate that it is presently charging, as shown by reference numeral 530 in FIG. 5. And, after the battery unit 250 is fully charged, the controller 260 further fills the third region and displays the still or steady icon with the dimmed color, that is, the first, second and third regions are filled with the dimmed color, as shown by reference numeral 540 in FIG. 5.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be rendered in such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein.

While the present invention has been particularly shown and described with reference to embodiments thereof, it will be understood by those of ordinary skill in the art that various changes in form and details may be made therein without departing from the spirit and scope of the present invention as defined by the following claims.

As described in the foregoing, a method and apparatus can display a battery charging-state of a portable terminal through an icon on the display, thus allowing a user to check a state where the battery has been charged, a charged capacity, and a remaining capacity of the battery.

What is claimed is:

1. A method for displaying a battery charging-state of a portable terminal, comprising:

(a) measuring a charged voltage of a battery unit;

(b)determining a charging stage of the measured charged voltage;

(c) sequentially and cyclically displaying during a charging period a plurality of sequential icons that are sequentially displayed in a unique sequence of icons changing states during each respective level of charge as an indication of both:

(1) a specific stage of a level of charge in said battery unit from a charged state of each respective charging stage to a fully charged state, and (2) that the battery unit is currently undergoing a charging operation;

(d) repeating step (a) to step (c) until the battery unit is fully charged;

wherein each specific stage of the level of charge is displayed according to a pre-stored display sequence for the icons.

2. The method of claim 1, wherein the steps of measuring, determining, and displaying are repeated until the battery unit is fully charged, wherein a single icon is steadily displayed.

3. The method of claim 1, wherein the determining the charging stage is performed by using charging stage display information formed of different values of charging voltages that are matched with icon data associated with each of the charging stages.

4. The method of claim 3, wherein the icon data comprises types and display sequence of icons to be displayed sequentially while recharging the battery, according to the charging stages.

5. The method of claim 1, wherein the step of sequentially displaying icons serves to display the icons in sequence based on types and display sequence.

6. The method of claim 1, wherein the step of sequentially displaying icons serves to display icons, distinguishing between a region of the icons indicating that a charging stage has been completed and another region indicating that charging is presently occurring.

7. A portable terminal comprising:

a storage unit for storing charging stage display information where the charging stage of a voltage is associated with icon data;

a battery unit for accepting a charging voltage supplied from a power source and for converting the charged voltage into a digital signal;

a controller for determining icon data based on the stage of charging of the charged voltage; and a display unit for displaying said icon data sequentially and repeatedly at each respective charging state during a charging period a plurality of sequential icons that are sequentially displayed in a unique sequence of icons changing states during each respective level of charge as an indication of both:

(1) a specific stage of a level of charge in said battery unit from an initial charged state of each respective charging stage to a fully charged state, and (2) that the battery unit is currently undergoing a charging operation;

wherein each specific stage of the level of charge is displayed according to a pre-stored display sequence for the icons.

8. The terminal of claim 7, wherein the controller comprises a charging stage determining unit.

9. The terminal of claim 7, wherein the controller displays icons, distinguishing between a region of the icons indicating that a charging stage has been completed and another region indicating that charging is presently occurring.

10. A portable terminal comprising:

a battery unit receiving a charging voltage, a charge determining unit measuring a level of voltage charge in said battery unit and determining an icon from a plurality of icons based on said measured level of voltage charge; and a display unit sequentially displaying each of said plurality of icons beginning from said determined icon, excluding selected ones of said plurality of icons and repeatedly displaying each of said plurality of icons until the battery unit is fully charged;

wherein each specific stage of the level of charge is displayed according to a pre-stored display sequence for the icons that is a unique display sequence of icons changing states during each respective level of charge as an indication of both:

(1) a specific stage of a level of charge in said battery unit from an initial charged state of each respective charging stage to a fully charged state, and (2) that the battery unit is currently undergoing a charging operation.

11. The portable terminal of claim 10, wherein the charging determining unit comprises:

a memory containing a plurality of progressively higher, non-overlapping, voltage ranges and icon information associated with each of said ranges.

12. The portable terminal of claim 11, wherein the step of determining an icon comprises:

selecting one of said plurality of voltages ranges based on said measured voltage level; and selecting an icon associated with the selected voltage range.

13. The portable terminal of claim 11, wherein the step of displaying further comprises the steps of:

displaying each of said icons in a different color.

14. The portable terminal of claim 10, the charge determining unit further comprising:

an analog-to-digital converter for converting said measured level of voltage to a digital signal.

15. The portable terminal of claim 10, wherein said icon display is held steady when a full level of charge is determined.

16. The portable terminal of claim 11, wherein said selected excluded icons are icons associated with voltage ranges lower than said measured voltage.

17. The portable terminal of claim 11, wherein each of said icons includes a plurality of sub-icons, wherein said sub-icons represent one of said plurality of voltage ranges.

18. A portable terminal comprising:

a rechargeable battery unit receiving a charging voltage;

a controller for:

(a)measuring a voltage charge in said battery unit;

(b)converting said measured voltage charge into a digital signal;

(c) determining an icon sequence based on said digital signal; and (d) repeating step (a) to step (c) until the battery unit is fully charged;

a display unit for cyclically displaying said icon sequence corresponding to a pre-stored display sequence for the icons that is a unique display sequence of icons changing states during each respective level of charge as an indication of both:

(1) a specific stage of a level of charge in said battery unit from an initial charged state of each respective charging stage to a fully charged state, and (2) that the battery unit is currently undergoing a charging operation.

19. The terminal of claim 18, wherein said icon sequence is determined based on said measured signal is within one of a plurality of non-overlapping, progressive higher voltage ranges.

20. The terminal of claim 19, wherein the determination of an icon sequence is performed by comparing said digital signal value to a plurality of range values.

*21. A method for displaying a charging status for a battery unit of an electronic device, comprising:*

*(a) measuring, by a controller of the electronic device, a charged voltage of the battery unit;*

*(b) determining, by the controller, a charging stage of the electronic device based on the measured voltage;*

*(c) cyclically displaying each of a plurality of icons in a sequence ranging from the charging stage to a fully charged stage on a display unit of the electronic device during a charging operation; and*

(*d*) *repeating step* (*a*) *to step* (*c*) *until the battery unit is fully charged,*

*wherein the displaying each of the plurality of icons in sequence indicates* (*1*) *the charging stage and* (*2*) *the battery unit is undergoing the charging operation,*

*wherein, if the charging stage is changed during the charging operation, each of the plurality of icons is displayed in a sequence ranging from the changed charging stage to the fully charged stage on the display unit of the electronic device.*

*22. The method of claim 21, wherein a single icon corresponding to the fully charged stage is displayed if the battery unit is fully charged.*

*23. The method of claim 21, wherein the determining the charging stage is performed by the controller using charging stage information corresponding to the charged voltage.*

*24. The method of claim 23, wherein the each of the plurality of icons is displayed in a sequence during the charging operation based on the charging stage information.*

*25. The method of claim 24, wherein the charging stage information includes the plurality of icons and a display sequence for an icon.*

*26. The method of claim 21, wherein cyclically displaying icons includes distinguishing between a region of the icons indicating that a respective charging stage has been completed and another region of the icons indicating that charging is presently occurring.*

*27. An electronic device comprising:*

*a battery unit;*

*a display unit configured to display a charging status for the battery unit of the electronic device;*

*a controller configured to* (*a*) *measure a charged voltage of the battery unit,* (*b*) *determine a charging stage of the electronic device based on the measured voltage,* (*c*) *control to display cyclically each of a plurality of icons in a sequence ranging from the charging stage to a fully charged stage on a display unit of the electronic device during a charging operation and* (*d*) *repeat step* (*a*) *to step* (*c*) *until the battery unit is fully charged,*

*wherein, if the charging stage is changed during the charging operation, each of the plurality of icons is displayed in a sequence ranging from the changed charging stage to the fully charged stage on the display unit of the electronic device.*

*28. The electronic device of claim 27, wherein the controller comprises a charging stage determining unit.*

*29. The electronic device of claim 27, wherein the controller controls to display cyclically icons to include distinguishing between a region of the icons indicating that a respective charging stage has been completed and another region of the icons indicating that charging is presently occurring.*

*30. A method for displaying a charging status for a battery unit of an electronic device, comprising:*

*measuring by a controller of the electronic device a charged voltage of the battery unit;*

*cyclically displaying a plurality of icons individually in a first sequence corresponding to a first charging stage, a second charging stage and a fully charged stage on a display unit of the electronic device if a charged voltage measured by the controller corresponds to the first charging stage; and*

*cyclically displaying a portion of the plurality of icons individually in a second sequence corresponding to the second charging stage and the fully charged stage on the display unit if a charged voltage measured by the controller corresponds to the second charging stage,*

*wherein at least the portion of the plurality of icons are sequentially displayed to indicate that the battery unit is undergoing a charging operation, and*

*wherein, if the first charging stage is changed to the second charging stage during the charging operation, the portion of the plurality of icons in the second sequence corresponding to the second charging stage and the fully charged stage are cyclically displayed on the display unit individually.*

*31. The method of claim 30, wherein a measured voltage corresponding to the second charging stage is higher than a measured voltage corresponding to the first charging stage.*

*32. An electronic device comprising:*

*a battery unit;*

*a display unit configured to display a charging status for the battery unit of the electronic device;*

*a controller configured to measure a charged voltage of the battery unit, control to display cyclically a plurality of icons individually in a first sequence corresponding to a first charging stage, a second charging stage and a fully charged stage on a display unit of the electronic device if a charged voltage measured by the controller corresponds to the first charging stage and control to display cyclically a portion of the plurality of icons individually in a second sequence corresponding to the second charging stage and the fully charged stage on the display unit if a charged voltage measured by the controller corresponds to the second charging stage,*

*wherein at least the portion of the plurality of icons are sequentially displayed to indicate that the battery unit is undergoing a charging operation, and*

*wherein, if the first charging stage is changed during the second charging stage during the charging operation, the portion of the plurality of icons in the second sequence corresponding to the second charging stage and the fully charged stage are cyclically displayed on the display unit individually.*

* * * * *

UNITED STATES PATENT AND TRADEMARK OFFICE

CERTIFICATE OF CORRECTION

PATENT NO. : RE45,797 E
APPLICATION NO. : 13/974581
DATED : November 10, 2015
INVENTOR(S) : Han Lim Kim It is certified that error appears in the above-identified patent and that said Letters Patent is hereby corrected as shown below:

In the claims
Column 10, Claim 32, Lines 45-47 should read as follows:
--…changed to the second charging stage during the charging operation, the portion…--

Signed and Sealed this
Fifteenth Day of March, 2016

Michelle K. Lee

Michelle K. Lee
*Director of the United States Patent and Trademark Office*